US009837397B2

(12) United States Patent
Onodera et al.

(10) Patent No.: US 9,837,397 B2
(45) Date of Patent: *Dec. 5, 2017

(54) NON-VOLATILE MEMORY AND DEVICES THAT USE THE SAME

(71) Applicant: VALLEY DEVICE MANAGEMENT, Wilmington, DE (US)

(72) Inventors: Masanori Onodera, Tokyo (JP); Kouichi Meguro, Tokyo (JP); Junji Tanaka, Tokyo (JP)

(73) Assignee: VALLEY DEVICE MANAGEMENT, Wilmington, DE (US)

(*) Notice: Subject to any disclaimer, the term of this patent is extended or adjusted under 35 U.S.C. 154(b) by 0 days.

This patent is subject to a terminal disclaimer.

(21) Appl. No.: 15/292,842

(22) Filed: Oct. 13, 2016

(65) Prior Publication Data

US 2017/0069614 A1 Mar. 9, 2017

Related U.S. Application Data

(60) Continuation of application No. 14/716,364, filed on May 19, 2015, now Pat. No. 9,472,540, which is a
(Continued)

(51) Int. Cl.
*H01L 23/28* (2006.01)
*H01L 25/00* (2006.01)
(Continued)

(52) U.S. Cl.
CPC .............. *H01L 25/50* (2013.01); *G06F 1/183* (2013.01); *H01L 21/56* (2013.01); *H01L 21/563* (2013.01);
(Continued)

(58) Field of Classification Search
CPC .............. H01L 21/568; H01L 21/6835; H01L 23/3128; H01L 23/3135
See application file for complete search history.

(56) References Cited

U.S. PATENT DOCUMENTS 6,762,488 B2 7/2004 Maeda et al.
6,766,320 B1 7/2004 Wang et al.
(Continued)

FOREIGN PATENT DOCUMENTS

JP 6177323 6/1994
JP 10223683 8/1998
(Continued)

OTHER PUBLICATIONS

Non-Final Office Action dated May 22, 2008; U.S. Appl. No. 11/514,390.
(Continued)

*Primary Examiner* — Dung Le
(74) *Attorney, Agent, or Firm* — Van Court & Aldridge LLP

(57) ABSTRACT

Various embodiments of the present disclosure include a non-volatile memory semiconductor device and a device that uses the same, the semiconductor device including a first semiconductor chip disposed on a substrate, a first sealing resin sealing the first semiconductor chip, a built-in semiconductor device disposed on the first sealing resin, and a second sealing resin sealing the first sealing resin and the built-in semiconductor device and covering a side surface of the substrate. According to an aspect of the present disclosure, it is possible to provide a high-quality semiconductor device, in which downsizing and cost reduction can be realized.

10 Claims, 10 Drawing Sheets

Related U.S. Application Data division of application No. 13/711,443, filed on Dec. 11, 2012, now Pat. No. 9,041,177, which is a division of application No. 12/965,706, filed on Dec. 10, 2010, now Pat. No. 8,329,562, which is a division of application No. 12/624,117, filed on Nov. 23, 2009, now Pat. No. 7,859,096, which is a division of application No. 11/514,390, filed on Aug. 30, 2006, now Pat. No. 7,626,253, which is a continuation-in-part of application No. PCT/JP2005/015694, filed on Aug. 30, 2005.

(51) Int. Cl.

| | | |
|---|---|---|
| *H01L 21/56* | (2006.01) | |
| *H01L 21/683* | (2006.01) | |
| *H01L 23/31* | (2006.01) | |
| *H01L 25/065* | (2006.01) | |
| *G06F 1/18* | (2006.01) | |
| *H01L 23/00* | (2006.01) | |
| *H01L 23/66* | (2006.01) | |
| *H01L 25/18* | (2006.01) | |

(52) U.S. Cl.
CPC ........ *H01L 21/568* (2013.01); *H01L 21/6835* (2013.01); *H01L 23/3128* (2013.01); *H01L 23/3135* (2013.01); *H01L 24/11* (2013.01); *H01L 24/85* (2013.01); *H01L 25/0657* (2013.01); *H01L 23/66* (2013.01); *H01L 24/73* (2013.01); *H01L 25/18* (2013.01); *H01L 2221/68331* (2013.01); *H01L 2223/6677* (2013.01); *H01L 2224/32145* (2013.01); *H01L 2224/32225* (2013.01); *H01L 2224/48091* (2013.01); *H01L 2224/48145* (2013.01); *H01L 2224/48227* (2013.01); *H01L 2224/48465* (2013.01); *H01L 2224/48471* (2013.01); *H01L 2224/48479* (2013.01); *H01L 2224/73265* (2013.01); *H01L 2224/85051* (2013.01); *H01L 2224/85986* (2013.01); *H01L 2225/0651* (2013.01); *H01L 2225/0652* (2013.01); *H01L 2225/06548* (2013.01); *H01L 2225/06568* (2013.01); *H01L 2225/06575* (2013.01); *H01L 2225/06586* (2013.01); *H01L 2924/00014* (2013.01); *H01L 2924/01004* (2013.01); *H01L 2924/01019* (2013.01); *H01L 2924/01078* (2013.01); *H01L 2924/14* (2013.01); *H01L 2924/15311* (2013.01); *H01L 2924/15331* (2013.01); *H01L 2924/181* (2013.01); *H01L 2924/19107* (2013.01)

(56) References Cited

U.S. PATENT DOCUMENTS

| | | | |
|---|---|---|---|
| 6,815,746 B2 | 11/2004 | Suzuki et al. | |
| 6,818,999 B2 | 11/2004 | Kikuma et al. | |
| 6,946,323 B1 | 9/2005 | Heo | |
| 7,087,455 B2 | 8/2006 | Fukuda et al. | |
| 7,205,644 B2 | 4/2007 | Kuo et al. | |
| 7,394,148 B2 | 7/2008 | Karnezos | |
| 7,626,253 B2 | 12/2009 | Onodera et al. | |
| 7,859,096 B2 * | 12/2010 | Onodera | H01L 21/568 257/686 |
| 8,330,263 B2 * | 12/2012 | Onodera | H01L 21/568 257/686 |
| 2002/0041025 A1 | 4/2002 | Tomihara | |
| 2003/0180988 A1 | 9/2003 | Kikuma et al. | |
| 2004/0065963 A1 | 4/2004 | Karnezos | |
| 2004/0145040 A1 | 7/2004 | Fukuda et al. | |
| 2006/0220208 A1 | 10/2006 | Onodera et al. | |
| 2006/0284299 A1 | 12/2006 | Karnezos | |
| 2007/0290318 A1 | 12/2007 | Tao et al. | |

FOREIGN PATENT DOCUMENTS

| | | |
|---|---|---|
| JP | 2003282814 | 10/2003 |
| JP | 2004063515 | 2/2004 |
| JP | 2004235310 | 8/2004 |
| JP | 2005302815 | 10/2005 |
| JP | 2006005333 | 1/2006 |
| JP | 2007005800 | 1/2007 |
| WO | 2006106569 | 10/2006 |

OTHER PUBLICATIONS

Non-Final Office Action dated Oct. 14, 2008, U.S. Appl. No. 11/514,390.

Non-Final Office Action dated Mar. 4, 2009; U.S. Appl. No. 11/514,390.

Non-Final Office Action dated Oct. 28, 2011; U.S. Appl. No. 12/965,672.

\* cited by examiner

NON-VOLATILE MEMORY AND DEVICES THAT USE THE SAME

CROSS REFERENCES TO RELATED APPLICATIONS

This application is a Continuation of U.S. patent application Ser. No. 14/716,364, filed May 19, 2015 (now U.S. Pat. No. 9,472,540), which is a Divisional of U.S. application Ser. No. 13/711,443, filed Dec. 11, 2012 (now U.S. Pat. No. 9,041,177), which is a Divisional of U.S. application Ser. No. 12/965,706 filed Dec. 10, 2010 (now U.S. Pat. No. 8,329,562), which is a Divisional of U.S. application Ser. No. 12/624,117 filed Nov. 23, 2009, now U.S. Pat. No. 7,859,096, which is Divisional of U.S. application Ser. No. 11/514,390 filed Aug. 30, 2006, now U.S. Pat. No. 7,626,253, which is a Continuation-In-Part of International Application No. PCT/JP2005/015694, filed Aug. 30, 2005, which was not published in English under PCT Article 21(2). Each of these earlier applications is hereby incorporated by reference.

TECHNICAL FIELD

This invention relates generally to semiconductor devices and fabrication methods therefore, and more particularly, to a stacked semiconductor device in which multiple semiconductor chips are mounted in a package and a fabrication method therefore.

BACKGROUND

Description of the Related Art

In recent years, downsizing is demanded for semiconductor devices for use in non-volatile memories of mobile electronics devices such as mobile telephones and IC memory cards. For downsizing, there is a need for packaging technology that the semiconductor chips are efficiently packaged.

FIG. 1 (PRIOR ART) is a cross-sectional view showing a Multi Chip Package (MCP) of Conventional Example 1. Referring to FIG. 1 (PRIOR ART), a semiconductor chip 86 is firmly attached on a relay substrate 80 by using a die attach material 84. A semiconductor chip 90 is firmly attached on the semiconductor chip 86 by using an adhesive 88. Wires 94 are electrically connected to the semiconductor chip 86, and wires 92 are electrically connected to the semiconductor chip 90. The semiconductor chips 86 and 90 are sealed with a sealing resin 96. Solder balls 82 are provided in the relay substrate 80, and the semiconductor chips 86 and 90 are electrically coupled to the outside via the solder balls 82. As described above, the semiconductor chips 86 and 90 are stacked and mounted in MCP.

FIG. 2 (PRIOR ART) is a cross-sectional view of Package on Package (PoP) of Conventional Example 2. Referring to FIG. 2 (PRIOR ART), a semiconductor chip 106 is firmly attached on a relay substrate 100 by using a die attached material 104. The semiconductor chip 106 is electrically connected to the relay substrate 100 by wires 108. The semiconductor chip 106 is sealed with a sealing resin 110. Similarly, a semiconductor chip 126 is firmly attached on a relay substrate 120 by using a die attach material 124. The semiconductor chip 126 is electrically coupled to the substrate 120 by wires 128. The semiconductor chip 126 is sealed with a sealing resin 130. The relay substrate 100 and the relay substrate 120 are electrically coupled by solder balls 122, and solder balls 102 are connected to the relay substrate 100. As described above, in PoP, the packaged semiconductor devices are stacked and mounted by means of bumps.

FIG. 3 (PRIOR ART) is a cross-sectional view of Package in Package (PiP) of Conventional Example 3 disclosed in Japanese Patent Application Publication No. 2003-282814. Referring to FIG. 3 (PRIOR ART), a relay substrate 150 is electrically coupled onto a relay substrate 140 by solder balls 152. A semiconductor chip 156 is firmly attached to the relay substrate 150 by die attach material 154. The semiconductor chip 156 is electrically coupled to the relay substrate 150 by wires 158. The semiconductor chip 156 is sealed with a sealing resin 160. A semiconductor chip 164 is firmly attached to the sealing resin 160 with the use of an adhesive 162. The semiconductor chip 164 is electrically coupled to the relay substrate 140 by using wires 166. The sealing resin 160 and the semiconductor chip 164 are sealed with a sealing resin 168. Solder balls 142 are connected to the relay substrate 140. As described above, in PiP, the packaged semiconductor device is coupled to the relay substrate by the solder balls and the packaged semiconductor device is sealed and mounted with the use of the sealing resin.

In the semiconductor device of Conventional Example 1, in the fabrication process thereof, when the semiconductor chip 86 is mounted on the relay substrate 80, the semiconductor chip 86 cannot be tested until the relay substrate 80 is cut. This is because the conductive pattern formed in the relay substrate 80 is connected to the relay substrates 80 of adjacent semiconductor chips. The conductive pattern is connected to adjacent relay substrates 80 so that current is flown through such connected conductive pattern at the time of forming the conductive pattern in the electrolytic plating process. Also, the semiconductor chip 86 is not sealed with the sealing resin before the semiconductor chip 90 is mounted. Unless the semiconductor chip 86 is tested, the subsequent fabrication process is performed on a defective semiconductor chip 86, thereby increasing the costs.

In the semiconductor device of Conventional Example 2, the area of the pad is needed to connect the relay substrate 100 and the relay substrate 120 by means of the solder balls 122. In addition, the height of the semiconductor is increased. In this manner, there are disadvantages in downsizing.

In the semiconductor device of Conventional Example 3, there are several tens of microns between the relay substrate 140 and the relay substrate 150. For this reason, when the sealing resin 168 is provided, it is difficult to fill the sealing resin between the relay substrate 140 and the relay substrate 150, and it is likely to result in voids. Since only the solder balls 152 are heat conduction paths from the relay substrate 140 to the relay substrate 150, it takes time to retain the temperature while the wires 166 are being bonded. This increases the costs. The height of the semiconductor also increases. As described, there are disadvantages in downsizing.

In the semiconductor device of Conventional Examples 1 through 3, the sealing resins 96, 130, and 168 are respectively provided only on top surfaces of the relay substrates 80, 120, and 140. Accordingly, in some cases, the sealing resin is peeled off from between the relay substrate and the sealing resin, due to the mechanical stress exerted onto the semiconductor device, temperature change, or moisture change.

SUMMARY

This Summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

The present invention has been made in view of the above circumstances and provides a semiconductor device in which the size and the costs can be reduced and the quality is excellent and a fabrication method therefore.

According to a first aspect of the present invention, there is provided a semiconductor device including: a first semiconductor chip disposed on a substrate; a first sealing resin sealing the first semiconductor chip; a built-in semiconductor device disposed on the first sealing resin; and a second sealing resin sealing the first sealing resin and the built-in semiconductor device and covering a side surface of the substrate. According to an aspect of the present invention, it is possible to prevent the second sealing resin from peeling off between the substrate and the second sealing resin, due to the mechanical stress, temperature change, and moisture change. Also, it is possible to reduce the height of the semiconductor device and downsize the semiconductor device. Accordingly, it is possible to provide a high-quality semiconductor device that can be downsized.

According to a second aspect of the present invention, there is provided a method of fabricating semiconductor device including: disposing first semiconductor chips on a substrate; sealing the first semiconductor chips by first sealing resins; cutting the substrate between the first sealing resins to form divided substrates; disposing divided substrates on a dummy sheet; forming a second sealing resin sealing built-in semiconductor devices disposed on the first sealing resins, and covering dummy sheet between the first sealing resins; and cutting the second sealing resin between the first sealing resins. According to an aspect of the present invention, it is possible to reduce the height of the semiconductor device and downsize the semiconductor device. Accordingly, it is possible to provide a high-quality semiconductor device that can be downsized.

DETAILED DESCRIPTION

Reference will now be made in detail to embodiments of the present claimed subject matter, examples of which are illustrated in the accompanying drawings. While the claimed subject matter will be described in conjunction with these embodiments, it will be understood that they are not intended to limit the claimed subject matter to these embodiments. On the contrary, the claimed subject matter is intended to cover alternatives, modifications and equivalents, which may be included within the spirit and scope of the claimed subject matter as defined by the appended claims. Furthermore, in the following detailed description of the present claimed subject matter, numerous specific details are set forth in order to provide a thorough understanding of the present claimed subject matter. However, it will be evident to one of ordinary skill in the art that the present claimed subject matter may be practiced without these specific details. In other instances, well known methods, procedures, components, and circuits have not been described in detail as not to unnecessarily obscure aspects of the claimed subject matter.

A description will now be given, with reference to the accompanying drawings, of embodiments of the present invention.

First Embodiment

Figure 1:
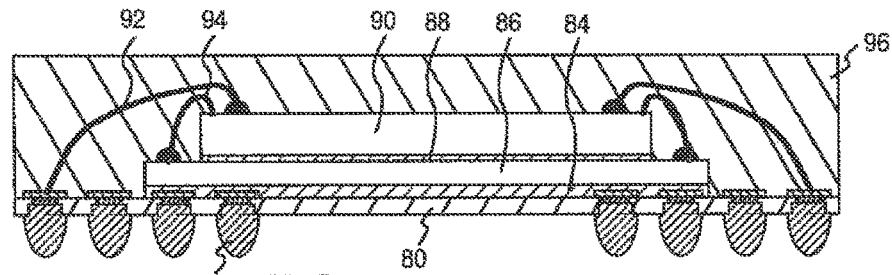
FIG. 1 (Prior Art) is a cross-sectional view of a semiconductor device in accordance with Conventional Example 1.
Figure 2:
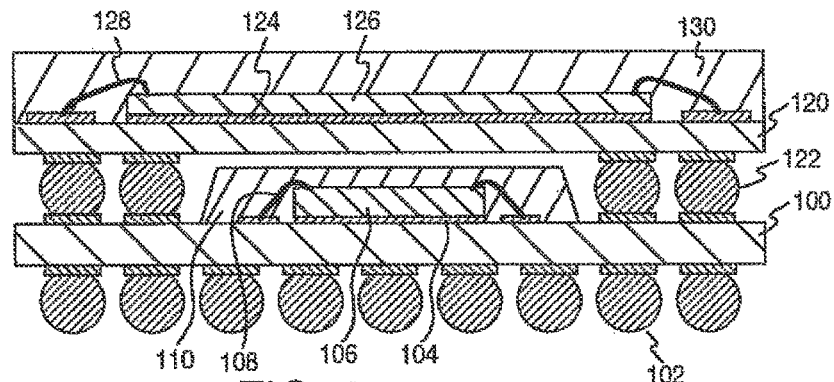
FIG. 2 (Prior Art) is a cross-sectional view of a semiconductor device in accordance with Conventional Example 2.
Figure 3:
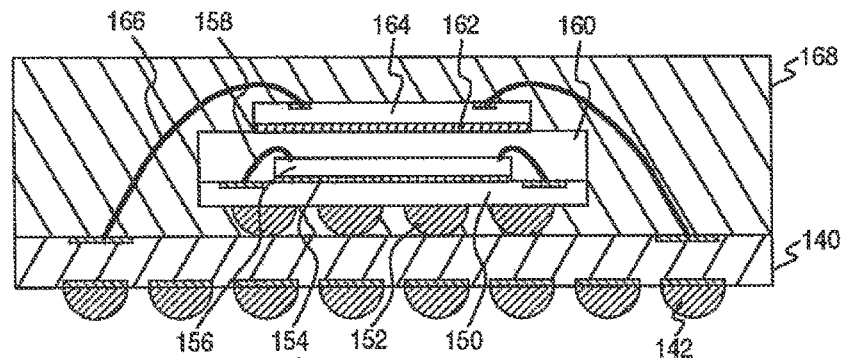
FIG. 3 (Prior Art) is a cross-sectional view of a semiconductor device in accordance with Conventional Example 3.
Figure 4:
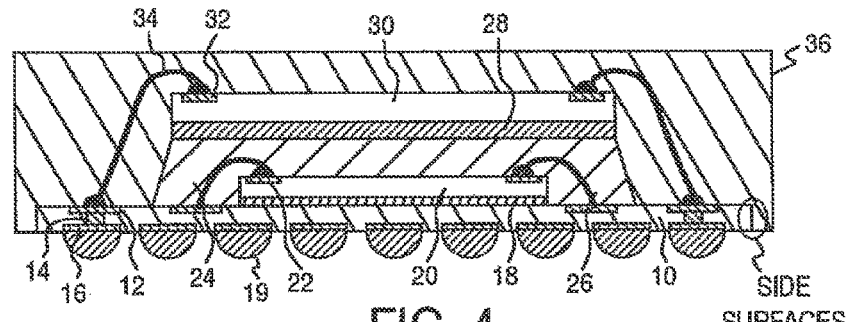
FIG. 4 is a cross-sectional view of a semiconductor device in accordance with a first embodiment of the present invention.

FIG. 4 is a cross-sectional view of a semiconductor device in accordance with a first embodiment of the present invention. There is disposed a first semiconductor chip 20, which is firmly attached on a relay substrate 10 (substrate) by using a die attach material 18. Pad electrodes 22 of the first semiconductor chip 20 are electrically coupled to pad electrodes 12 of the relay substrate 10 by wires 24. The first semiconductor chip 20 is sealed with a first sealing resin 26. There is disposed a semiconductor chip 30 (built-in semiconductor device), which is attached on the first sealing resin 26 by using an adhesive 28. Pad electrodes 32 of the second semiconductor chip 30 are electrically coupled to the pad electrodes 12 of the relay substrate 10 by wires 34. The first sealing resin 26 and the second semiconductor chip 30 are sealed with a second sealing resin 36. In addition, side surfaces S of the relay substrate 10 are covered with the second sealing resin 36. The relay substrate 10 is provided with bumps 19 on bump electrodes 16 provided on a surface opposing the surface on which the first semiconductor chip is provided. The bump electrodes 16 and the pad electrodes 12 are electrically coupled by connection holes 14.

Figure 5A:
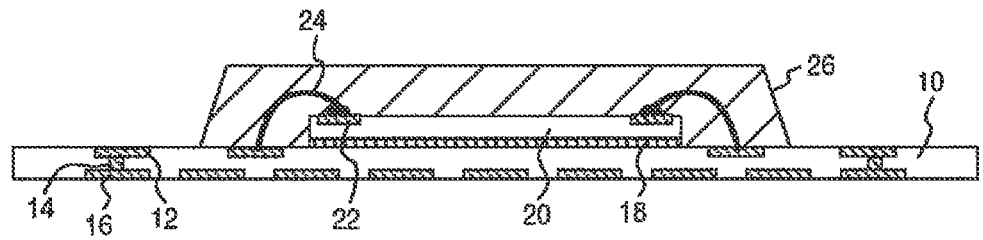
FIG. 5A through FIG. 5D are cross-sectional views showing (first) fabrication processes of the semiconductor device in accordance with a first embodiment of the present invention.

A fabrication method of the semiconductor device employed in the first embodiment will be described with reference to FIG. 5A through FIG. 6C. The same components and configurations as those of FIG. 4 have the same reference numerals. Referring now to FIG. 5A, the first semiconductor chip 20 is firmly attached on the relay substrate 10 made of glass epoxy by using the die attach material 18 of Ag paste or the like. At this time, multiple relay substrates 10 are successively connected in a lateral direction of the drawing. This is for fabricating multiple semiconductor devices simultaneously. However, in the drawings, only a portion where one semiconductor device fabricated on the relay substrate is shown. There are provided the pad electrodes 12 and another conductive pattern on the surface of the relay substrate 10 on which the first semiconductor chip 20 is disposed, and there are provided the bump electrodes 16 and another conductive pattern on an opposite surface. The conductive pattern provided on the surface is coupled to that provided on the opposite surface by connection holes 14. The pad electrodes 22 of the first semiconductor chip 20 are wire bonded to the pad electrodes 12 of the relay substrate 10 by the wires 24. The first semiconductor chip 20 is sealed with, for example, an epoxy resin, and the first sealing resin 26 is provided.

Figure 5B:
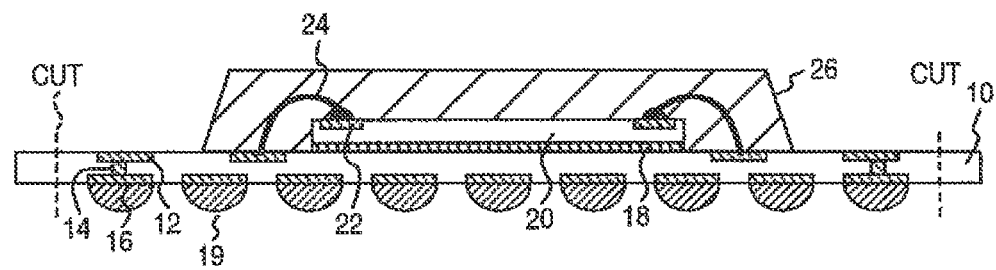
Figure 5C:
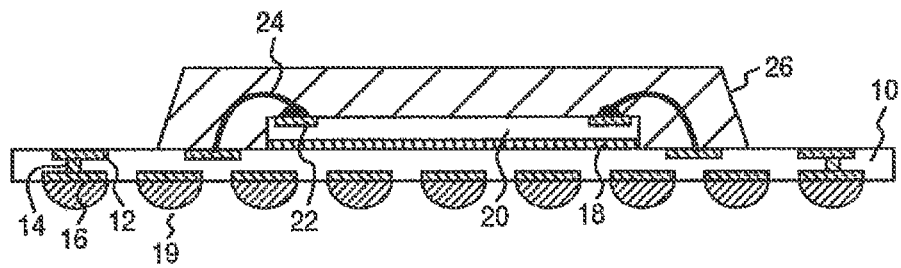

Referring to FIG. 5B, the bumps 19 are formed by solder on an opposing surface of the surface on which the first semiconductor chip 20 of the relay substrate 10 is disposed. At this time, the height of the bumps 19 is approximately 100 μm. The relay substrate 10 is cut between the first sealing resins 26. Referring to FIG. 5C, an electrical testing is performed on the first semiconductor chip 20 disposed on such cut relay substrate 10. Then, only the first semiconductor chip 20 that has passed the electrical testing is passed onto the next fabrication process.

Figure 5D:
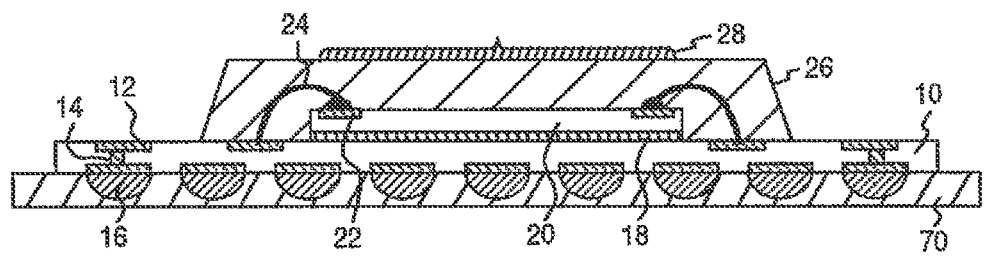

Referring to FIG. 5D, the relay substrate 10 is arranged on a dummy sheet 70 in such a manner that the bumps 19 are embedded in the dummy sheet 70 and the dummy sheet 70 is firmly attached to the relay substrate 10. In one embodiment, a flexible fluorinated or silicone series resin of, for example, 200 μm to 500 μm, should be employed as the dummy sheet 70. The bumps 19 can be embedded in the dummy sheet 70 by providing the dummy sheet 70 sufficiently greater in height than the bumps 19. Multiple dummy sheets 70 are successively connected in a lateral direction of the drawing. However, in the drawings, out of the multiple dummy sheets 70, only a portion where one semiconductor device is fabricated is shown. The adhesive 28 is applied on the first sealing resin 26.

Figure 6A:
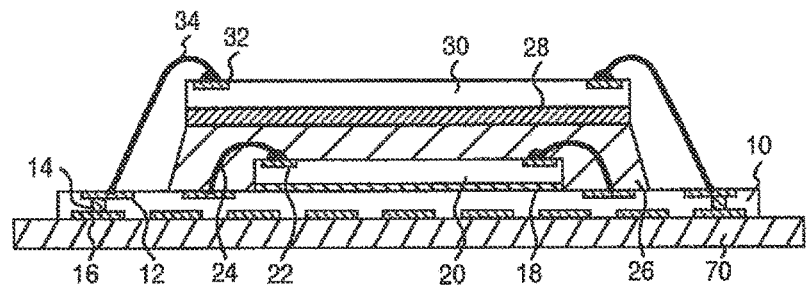
FIG. 6A through FIG. 6C are cross-sectional views showing (second) fabrication processes of the semiconductor device in accordance with a first embodiment of the present invention.
Figure 6B:
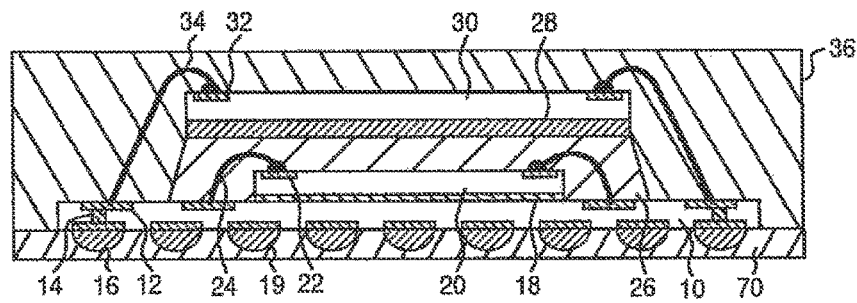

Referring to FIG. 6A, the second semiconductor chip 30 is firmly attached onto the first sealing resin 26 by using the adhesive 28. The pad electrodes 32 of the second semiconductor chip 30 are wire bonded to the pad electrodes 12 of the relay substrate 10 by using the wires 34. Referring to FIG. 6B, the second semiconductor chip 30 is sealed with an epoxy resin to form the second sealing resin 36 that covers the second semiconductor chip 30 and the dummy sheet 70 between the first sealing resins 26.

Figure 6C:
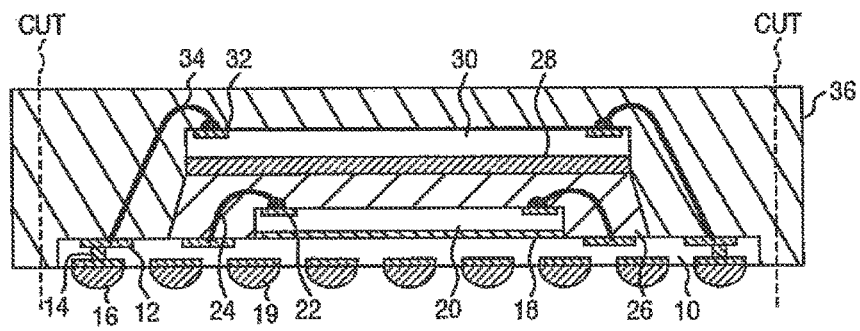

Referring to FIG. 6C, the second sealing resin 36 is cut between the first sealing resins 26. At this time, the second sealing resin 36 is cut in such a manner that the second sealing resin 36 remains the on the side surfaces of the relay substrate 10. As described, the semiconductor device employed in the first embodiment is completed.

In the first embodiment, the side surfaces S of the relay substrate 10 are covered with the second sealing resin 36. Accordingly, when the semiconductor device employed in the first embodiment is mounted, it is possible to prevent the second sealing resin 36 from peeling off from the portion between the relay substrate 10 and the second sealing resin 36 due to the mechanical stress, the temperature change, or the moisture change. In addition, unlike Conventional Examples 2 and 3, the bumps such as the solder balls, solder bumps, or the like are not used for mounting the semiconductor chips 20 and 30 on the relay substrate 10. Therefore, the height of the semiconductor device can be decreased, thereby downsizing the semiconductor device. If the side surfaces S of the relay substrate 10 are partially covered with the seconds sealing resin 36, the effect is obtainable. However, in one embodiment, all the side surfaces S are covered with the second sealing resin 36 to bring about the effect more.

In addition, when the semiconductor device employed in the first embodiment is fabricated, the first semiconductor chip 20 is mounted on the relay substrate 10 (FIG. 5A) and the relay substrate 10 is cut (FIG. 5B).

Subsequently, the relay substrate 10 is disposed on the dummy sheet 70 (FIG. 5D), and the second semiconductor chip 30 is disposed on the first sealing resin 26 (FIG. 6A). Accordingly, the conductive pattern provided on the surface of the relay substrate 10 is cut before the relay substrate 10 is disposed on the dummy sheet 70. In addition, the first semiconductor chip 20 is sealed with the first sealing resin 26. Accordingly, the electrical testing can be performed on the first semiconductor chip 20 provided on such cut relay substrate 10 (FIG. 5C), before the process of providing such cut relay substrate on the dummy sheet (FIG. 5D). It is therefore possible to prevent an electrically defective first semiconductor chip 20 from going onto the subsequent fabrication process, with the first semiconductor chip 20 mounted. This makes it possible to suppress the fabrication costs. As described above, it is possible to provide a smaller-sized, low-cost, and high-quality semiconductor device and a fabrication method therefore.

When the relay substrate 10 is disposed on the dummy sheet 70, the relay substrate 10 is disposed such that the bumps 19 are embedded in the dummy sheet 70 (FIG. 5D). The wire bonding to the second semiconductor chip 30 is performed at, for example, 170° C.-180° C. If there is a spacing between the dummy sheet 70 and the relay substrate 10, the heat is not transmitted to the pad electrodes 32 during the wire bonding, causing a defective wire bonding. When the second sealing resin 36 is provided, the sealing resin may be filled in the above-described spacing. Therefore, the bumps 19 are embedded in the dummy sheet 70. This improves the heat transmission between the dummy sheet 70 and the relay substrate 10, and can suppress a defective wire bonding. This also prevents the sealing resin from entering the spacing between the dummy sheet 70 and the relay substrate 10. Accordingly, it is possible to provide a fabrication method of a high-quality semiconductor device.

Second Embodiment

Figure 7:
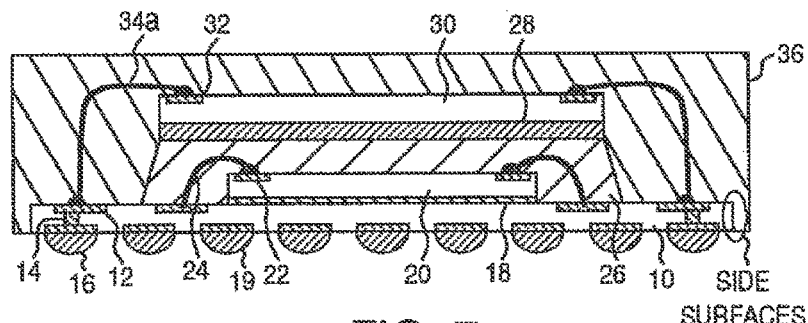
FIG. 7 is a cross-sectional view of a semiconductor device in accordance with a second embodiment of the present invention.

FIG. 7 is a cross-sectional view of a semiconductor device in accordance with a second embodiment of the present invention. The same components and configurations as those employed in the first embodiment have the same reference numerals and a detailed explanation will be omitted. In the second embodiment, the pad electrodes 32 of the second semiconductor chip 30 are wire bonded to the pad electrodes 12 of the relay substrate 10 from the pad electrodes 12 to the pad electrodes 32 (reverse bonding). So, wires 34a can be lower than those employed in the first embodiment. Accordingly, the second sealing resin 36 can be lower and the semiconductor device can be downsized.

Third Embodiment

Figure 8:
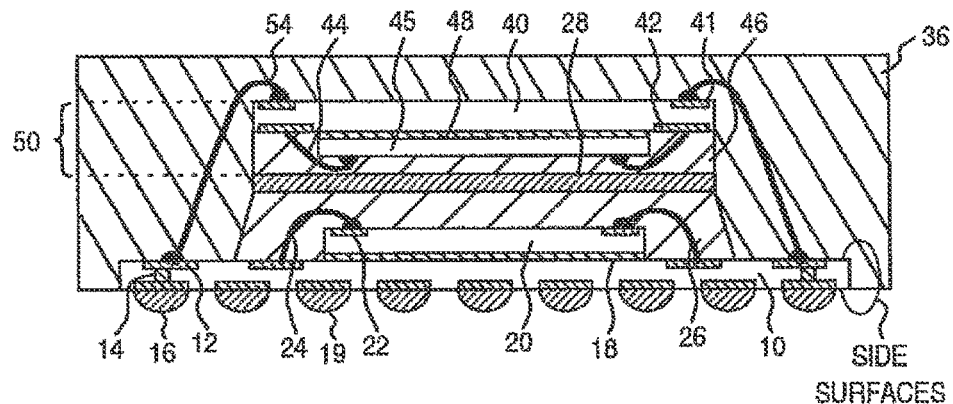
FIG. 8 is a cross-sectional view of a semiconductor device in accordance with a third embodiment of the present invention.

FIG. 8 is a cross-sectional view of a semiconductor device in accordance with a third embodiment of the present invention. In the third embodiment, a semiconductor device 50 having a second semiconductor chip 45 built therein is mounted, instead that the second semiconductor chip 30 employed in the first embodiment is directly provided. Other configurations are same as those employed in the first embodiment, and the same components and configurations as those employed in the first embodiment have the same reference numerals and a detailed explanation will be omitted. Referring to FIG. 8, in the built-in semiconductor device 50, the second semiconductor chip 45 is firmly attached onto (below, in the drawing) the relay substrate 40 by using a die attach material 48. The second semiconductor chip 45 and pad electrodes 42 of the relay substrate 40 are connected by wires 44. The second semiconductor chip 45 is sealed with a third sealing resin 46. The built-in semiconductor device 50 is firmly attached and located on the first sealing resin 26 by the adhesive 28. Pad electrodes 41 of the built-in semiconductor device 50 are electrically coupled to the pad electrodes 12 of the relay substrate 10 by wires 54.

In the third embodiment, the built-in semiconductor device 50 includes the second semiconductor chip 45 and the third sealing resin 46 that seals the second semiconductor chip 45. In this manner, it is possible to provide a resin-sealed package having in which the semiconductor chip 45 is mounted as the built-in semiconductor device 50.

Fourth Embodiment

Figure 9:
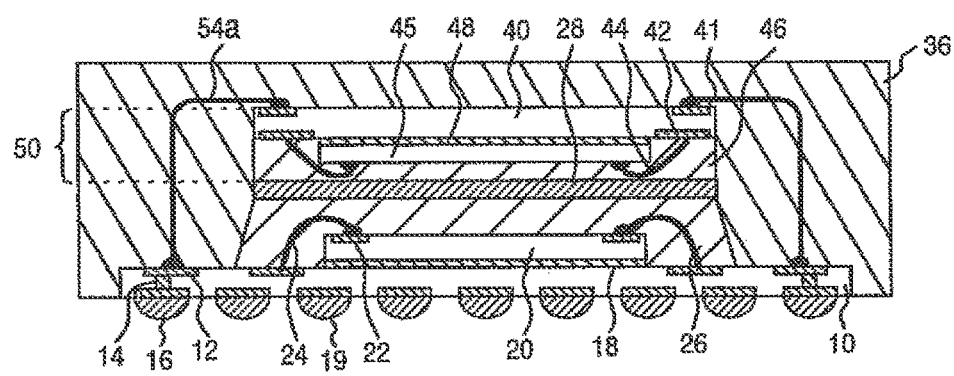
FIG. 9 is a cross-sectional view of a semiconductor device in accordance with a fourth embodiment of the present invention.

FIG. 9 is a cross-sectional view of a semiconductor device in accordance with a fourth embodiment of the present invention. The same components and configurations as those employed in the third embodiment have the same reference numerals and a detailed explanation will be omitted. In the fourth embodiment, the pad electrodes 41 of the built-in semiconductor device 50 are wire bonded to the pad electrodes 12 of the relay substrate 10 from the pad electrodes 12 to the pad electrodes 41 (reverse bonding). So, wires 54a can be lower than those employed in the third embodiment. Accordingly, the second sealing resin 36 can be lower, thereby downsizing the semiconductor device.

In the first through fourth embodiments, no bumps are used to mount the first semiconductor chip 20 and the second semiconductor chip 30 or the first semiconductor chip 20 and the built-in semiconductor device 50, on the relay substrate 10. Accordingly, the semiconductor device can be lowered in height, and can be miniaturized. As in the first and second embodiments, the semiconductor device can be further lowered in height by arranging the second semiconductor chip 30 on the first sealing resin 26 than those employed in the third and fourth embodiments. Meanwhile, in the third and fourth embodiments, only the built-in semiconductor devices 50 can be mounted after the electrical testing is accomplished in a state where the second semiconductor chip 45 is sealed with the sealing resin 46 in the built-in semiconductor device 50, thereby reducing the costs.

Fifth Embodiment

Figure 10:
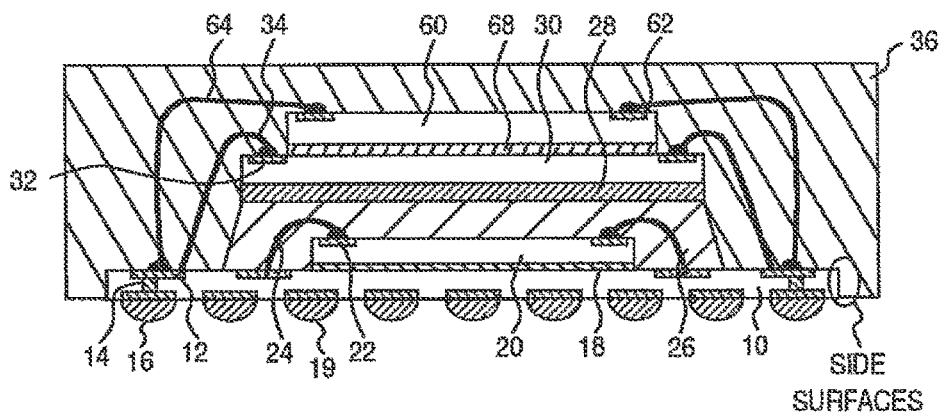
FIG. 10 is a cross-sectional view of a semiconductor device in accordance with a fifth embodiment of the present invention.

FIG. 10 is a cross-sectional view of a semiconductor device in accordance with a fifth embodiment of the present invention. The fifth embodiment is an example in which a third semiconductor chip 60 is located on the second semiconductor chip 30 employed in the first embodiment. Other configurations are same as those employed in the first embodiment, and the same components and configurations as those employed in the first embodiment have the same reference numerals and a detailed explanation will be omitted. The third semiconductor chip 60 is firmly attached onto the second semiconductor chip 30 with an adhesive 68. Pad electrodes 62 of the third semiconductor chip 60 are electrically coupled to the pad electrodes 12 of the relay substrate 10 by wires 64. The first sealing resin 26, the second semiconductor chip 30, and the third semiconductor chip 60 are sealed by the second sealing resin 36.

In the fifth embodiment, the third semiconductor chip 60 is located on the second semiconductor chip 30, and the second sealing resin 36 seals the first sealing resin 26, the second semiconductor chip 30, and the third semiconductor chip 60. In this manner, three layers of the semiconductor chips 20, 30, and 60 are provided, thereby allowing higher packaging density of the built-in semiconductor device. In Conventional Examples 2 and 3, the semiconductor devices are great in thickness, and in addition, it is difficult to stack the semiconductor chips. In the fifth embodiment, even when the third semiconductor chip 60 is stacked in addition to the configuration employed in the first embodiment, the semiconductor device is not large in thickness unlike Conventional Examples 2 and 3. Therefore, it is possible to stack the semiconductor chips with ease, thereby making it possible to downsize the semiconductor device.

Sixth Embodiment

Figure 11A:
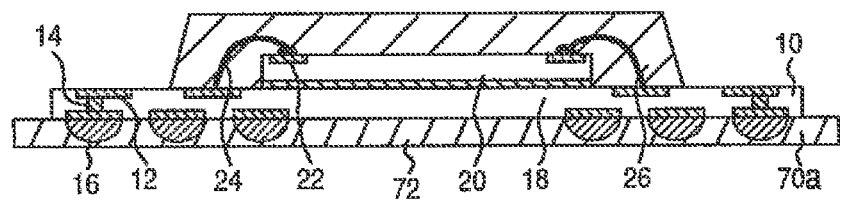
FIG. 11A is a cross-sectional view of a fabrication process of the semiconductor device in accordance with a sixth embodiment of the present invention.
Figure 11B:
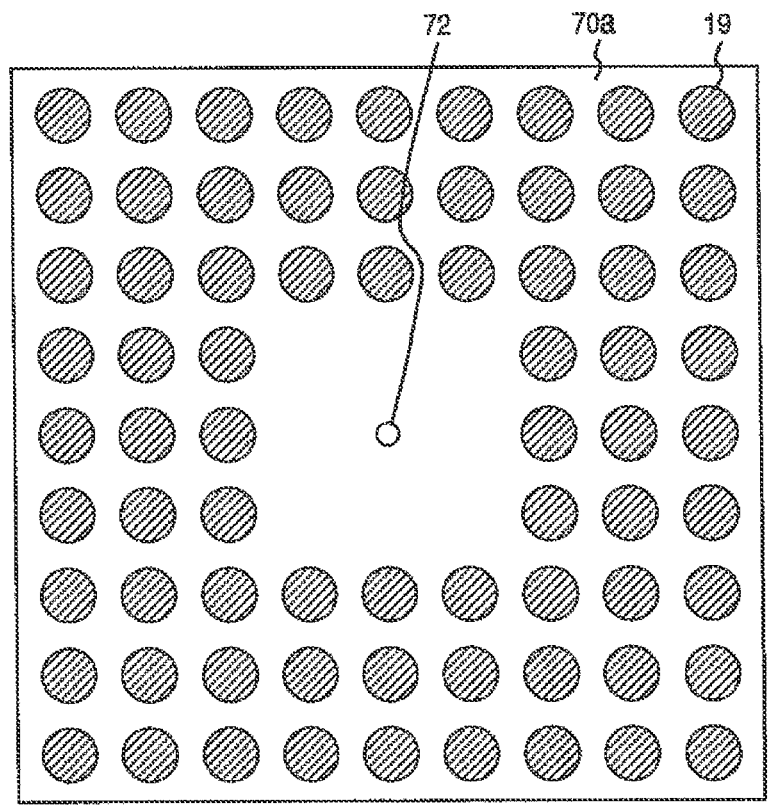
FIG. 11B is a view when viewed from the bottom.

A fabrication method of the semiconductor device employed in the sixth embodiment is an example in which an opening 72 is provided in a dummy sheet 70a. Other configurations are same as those employed in the first embodiment, and the same components and configurations as those employed in the first embodiment have the same reference numerals and a detailed explanation will be omitted. FIG. 11A is a view showing the relay substrate 10 located on the dummy sheet 70a, after the same fabrication processes shown in FIG. 5A through FIG. 5C described in the first embodiment are completed. The dummy sheet 70a is provided with the opening 72 in a region where the relay substrate 10 that has been cut is arranged. FIG. 11B is a view showing the dummy sheet 70a, when viewed from the bottom, with the positions of the bumps 19 transparent. There is no bump 19 arranged in the middle of the relay substrate 10, and the opening 72 is provided therein. Subsequently, the fabrication process same as that employed in the first embodiment is accomplished.

In the sixth embodiment, during the wire bond process as shown in FIG. 6A used in the first embodiment, vacuum contact of the relay substrate 10 is enabled on a stage of a wire bonder through the opening 72. This can prevent the relay substrate 10 from tilting on the stage of the wire bonder, and can also prevent the misalignment of the relay substrate 10. The bumps 19 and the dummy sheet 70a are firmly attached to each other, thereby improving the heat transmission between the relay substrate 10 and the dummy sheet 70a. It is therefore possible to suppress the defective wire bonding, thereby leading to the fabrication method of a high-quality semiconductor device. Also, in the sixth embodiment, there may be provided multiple openings 72.

Seventh Embodiment

Figure 12A:
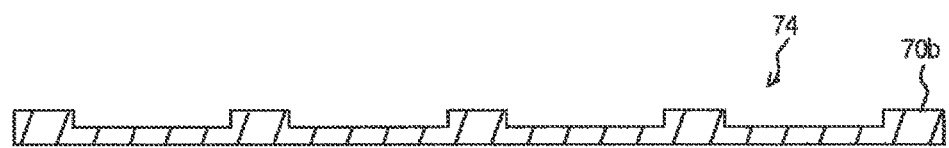
FIG. 12A is a cross-sectional view of a dummy sheet for use in the fabrication process of the semiconductor device in accordance with a seventh embodiment of the present invention.
Figure 12B:
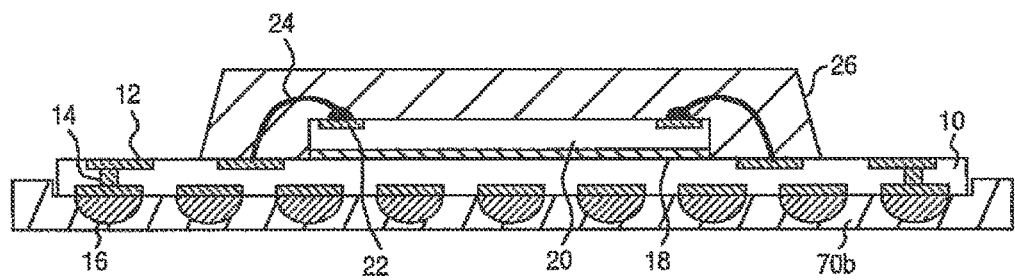
FIG. 12B is a cross-sectional view of the fabrication process.

A fabrication method of the semiconductor device employed in a seventh embodiment is an example in which depressions 74 are provided in a dummy sheet 70b. Other configurations are same as those employed in the first embodiment, and the same components and configurations as those employed in the first embodiment have the same reference numerals and a detailed explanation will be omitted. FIG. 12A is a cross-sectional view of the dummy sheet 70b, and FIG. 12b is a view showing the relay substrate 10 located on the dummy sheet 70b, after the same fabrication processes shown in FIG. 5A through FIG. 5C described in the first embodiment are completed. The dummy sheet 70b is provided with the depression 74 in a region where the relay substrate 10 that has been cut is arranged. Multiple depressions 74 are provided in FIG. 12A; however, one depression 74 is shown in FIG. 12B. Subsequently, the same fabrication process as that employed in the first embodiment is performed. In the seventh embodiment, the relay substrate 10 is located in the depression 74, thereby making it possible to prevent the misalignment of the relay substrate 10 on the dummy sheet 70b in the subsequent fabrication processes. It is therefore possible to provide a fabrication method of a high-quality semiconductor device. In addition, in the seventh embodiment, the opening 72 may be provided in a similar manner as the sixth embodiment.

In the first through seventh embodiments, the bumps 19 are solder bumps that have shapes of crushed semicircle, but spherical solder balls may be employed. However, in one embodiment, the solder bumps that have shapes of crushed semicircle should be employed so as to be embedded in the dummy sheet 70. If the solder balls are employed, in one embodiment, the sizes thereof are decreased.

The relay substrate made of a glass epoxy is employed as a substrate on which the semiconductor chip is mounted. However, there is no limitation thereto, and there may be employed a substrate made of a substrate of an insulator and having a conductive pattern to be electrically coupled to the semiconductor chip.

In addition, there may be employed a dummy sheet of a double structure having the base substance and an adhesion portion thicker than the bumps 19. By using such dummy sheet 70, the bumps 19 can be embedded in the adhesive portion. Furthermore, there may be employed a metal dummy sheet or a dummy sheet made of an insulator. In the sixth embodiment, in particular, excellent heat transmission is achieved between the relay substrate 10 and the dummy sheet 70a. Therefore, the bumps 19 need not to be embedded in the dummy sheet 70a, and a metal dummy sheet may be employed. Also, in the seventh embodiment, in a case where the depressions 74 are provided in the dummy sheet 70b, in one embodiment, a fluorinated resin that can be processed with ease should be employed. As described above, a soft or hard material may be employed for the dummy sheet 70.

Embodiments of the present claimed subject matter generally relates to semiconductor devices. More particularly, embodiments allow semiconductor devices to function with increased efficiency. In one implementation, the claimed subject matter is applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Exemplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive navigation devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones.).

Flash memory stores information in an array of floating gate transistors, called "cells", each of which traditionally stores one bit of information. However, newer flash memory devices, such as MirrorBit Flash Technology from Spansion Inc., can store more than 1 bit per cell. The MirrorBit cell doubles the intrinsic density of a Flash memory array by storing two physically distinct bits on opposite sides of a memory cell. Each bit serves as a binary bit of data (e.g., either 1 or 0) that is mapped directly to the memory array. Reading or programming one side of a memory cell occurs independently of whatever data is stored on the opposite side of the cell.

With regards to wireless markets, flash memory that utilizes MirrorBit technology has several key advantages. For example, flash memory that utilizes MirrorBit technology are capable of burst-mode access as fast as 80 MHz, page access times as fast as 25 ns, simultaneous read-write operation for combined code and data storage, and low standby power (e.g., 1 µA).

Figure 13:
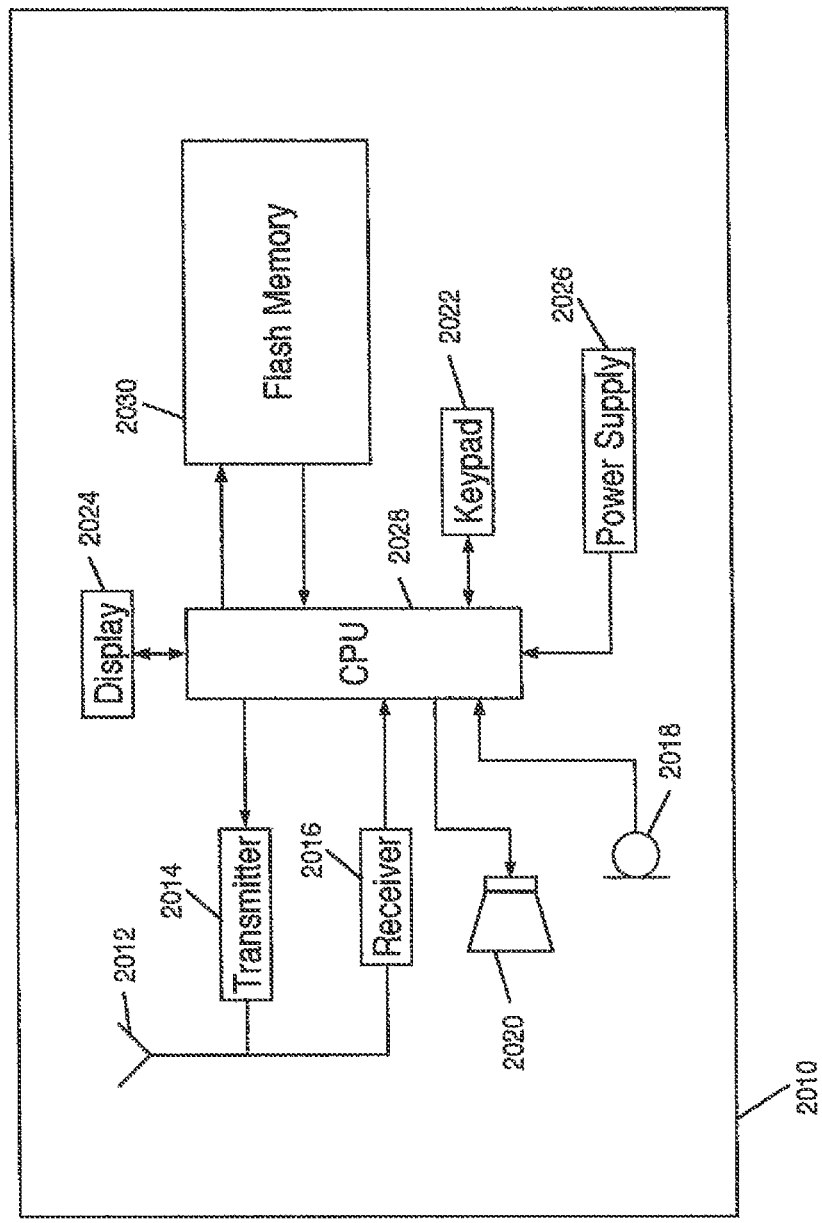
FIG. 13 illustrates a block diagram of a conventional portable phone, upon which embodiments can be implemented.

FIG. 13 shows a block diagram of a conventional portable telephone 2010 (a.k.a. cell phone, cellular phone, mobile phone, internet protocol phone, wireless phone, etc.), upon which embodiments can be implemented. The cell phone 2010 includes an antenna 2012 coupled to a transmitter 2014 a receiver 2016, as well as, a microphone 2018, speaker 2020, keypad 2022, and display 2024. The cell phone 2010 also includes a power supply 2026 and a central processing unit (CPU) 2028, which may be an embedded controller, conventional microprocessor, or the like. In addition, the cell phone 2010 includes integrated, flash memory 2030. Flash memory 2030 includes: a first semiconductor chip disposed on a substrate; a first sealing resin sealing the first semiconductor chip; a built-in semiconductor device disposed on the first sealing resin; and a second sealing resin sealing the first sealing resin and the built-in semiconductor device and covering a side surface of the substrate.

In this way, embodiments improve the final yield of semiconductor device manufacturing process. This improvement in yield translate into cost reduction for the manufacturing of various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones.

Flash memory comes in two primary varieties, NOR-type flash and NAND-type flash. While the general memory storage transistor is the same for all flash memory, it is the interconnection of the memory cells that differentiates the designs. In a conventional NOR-type flash memory, the memory cell transistors are connected to the bit lines in a parallel configuration, while in a conventional NAND-type flash memory, the memory cell transistors are connected to the bit lines in series. For this reason, NOR-type flash is sometimes referred to as "parallel flash" and NAND-type flash is referred to as "serial flash."

Traditionally, portable phone (e.g., cell phone) CPUs have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps.), flash memory requirements have steadily increased. Thus, a more efficient flash memory will render a portable phone more competitive in the telecommunications market.

Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

Figure 14:
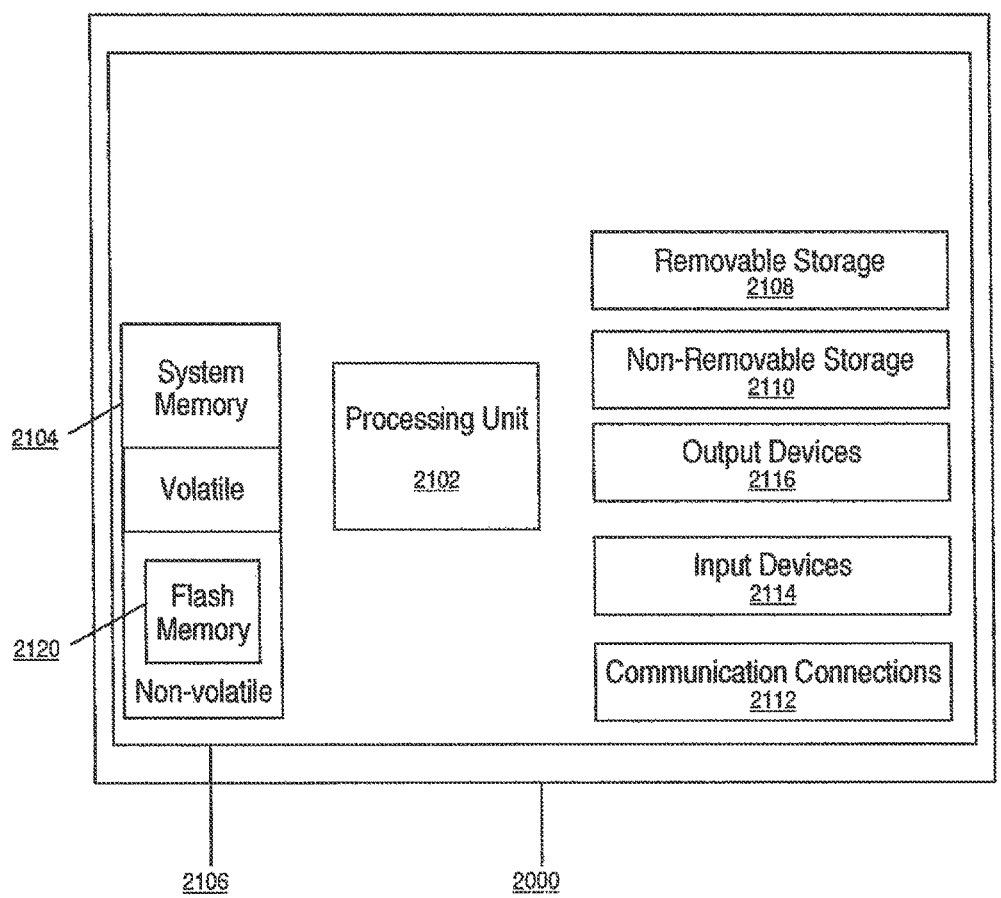
FIG. 14 illustrates a block diagram of a computing device, upon which embodiments of the present claimed subject matter can be implemented.

FIG. 14 illustrates a block diagram of a computing device 2100, upon which embodiments of the present claimed subject matter can be implemented. Although computing device 2100 is shown and described in FIG. 14 as having certain numbers and types of elements, the embodiments are not necessarily limited to the exemplary implementation. That is, computing device 2100 can include elements other than those shown, and can include more than one of the elements that are shown. For example, computing device 2100 can include a greater number of processing units than the one (processing unit 2102) shown. Similarly, in another example, computing device 2100 can include additional components not shown in FIG. 14.

Also, it is important to note that the computing device 2100 can be a variety of things. For example, computing device 2100 can be but are not limited to a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounters frequent physical impacts. Also, flash memory is more able than other types of memory to withstand intense physical pressure and/or heat. And thus, portable computing devices are able to be used in a greater range of environmental variables.

In its most basic configuration, computing device 2100 typically includes at least one processing unit 2102 and memory 2104. Depending on the exact configuration and type of computing device, memory 2104 may be volatile (such as RAM), non-volatile (such as ROM, flash memory, etc.) or some combination of the two. This most basic configuration of computing device 2100 is illustrated in FIG. 14 by line 2106. Additionally, device 2100 may also have additional features/functionality. For example, device 2100 may also include additional storage (removable and/or non-removable) including, but not limited to, magnetic or optical disks or tape. In one example, in the context of a gaming system, the removable storage could a game cartridge receiving component utilized to receive different game cartridges. In another example, in the context of a Digital Video Disc (DVD) recorder, the removable storage is a DVD receiving component utilized to receive and read DVDs. Such additional storage is illustrated in FIG. 14 by removable storage 2108 and non-removable storage 2110. Computer storage media includes volatile and nonvolatile, removable and non-removable media implemented in any method or technology for storage of information such as computer readable instructions, data structures, program modules or other data. Memory 2104, removable storage 2108 and non-removable storage 2110 are all examples of computer storage media.

Computer storage media includes, but is not limited to, RAM, ROM, EEPROM, flash memory 2120 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 2100. Any such computer storage media may be part of device 2100.

In the present embodiment, the flash memory 2120 comprises: a first semiconductor chip disposed on a substrate; a first sealing resin sealing the first semiconductor chip; a built-in semiconductor device disposed on the first sealing resin; and a second sealing resin sealing the first sealing resin and the built-in semiconductor device and covering a side surface of the substrate.

In this way, embodiments improve the final yield of semiconductor device manufacturing process. This improvement in yield translate into cost reduction for the manufacturing of various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones.

Further, in one embodiment, the flash memory 2120 utilizes mirrorbit technology to allow storing of two physically distinct bits on opposite sides of a memory cell.

Device 2100 may also contain communications connection(s) 2112 that allow the device to communicate with other devices. Communications connection(s) 2112 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. The term computer readable media as used herein includes both storage media and communication media.

Device 2100 may also have input device(s) 2114 such as keyboard, mouse, pen, voice input device, game input device (e.g., a joy stick, a game control pad, and/or other types of game input device), touch input device, etc. Output device(s) 2116 such as a display (e.g., a computer monitor and/or a projection system), speakers, printer, network peripherals, etc., may also be included. All these devices are well know in the art and need not be discussed at length here.

Aside from mobile phones and portable computing devices, flash memory is also widely used in portable multimedia devices, such as portable music players. As users would desire a portable multimedia device to have as large a storage capacity as possible, an increase in memory density would be advantageous. Also, users would also benefit from reduced memory read time.

Figure 15:
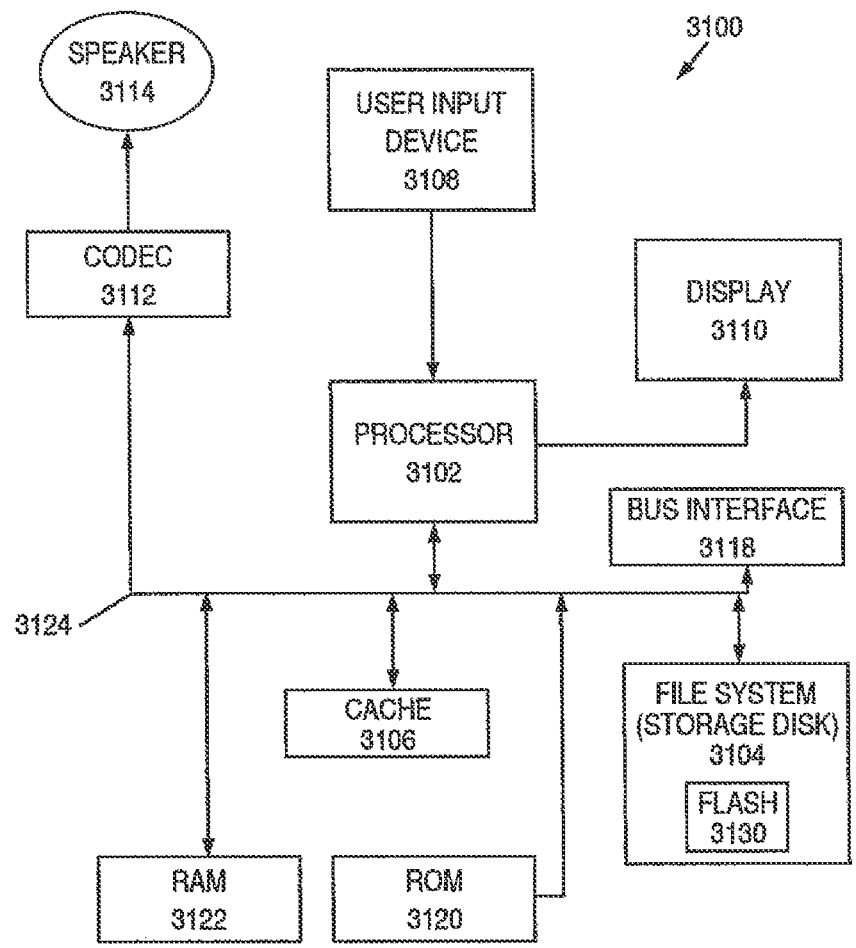
FIG. 15 illustrates an exemplary portable multimedia device, or media player, in accordance with an embodiment of the present claimed subject matter.

FIG. 15 shows an exemplary portable multimedia device, or media player, 3100 in accordance with an embodiment of the invention. The media player 3100 includes a processor 3102 that pertains to a microprocessor or controller for controlling the overall operation of the media player 3100. The media player 3100 stores media data pertaining to media assets in a file system 3104 and a cache 3106. The file system 3104 is, typically, a storage disk or a plurality of disks. The file system 3104 typically provides high capacity storage capability for the media player 3100. Also, file system 3104 includes flash memory 3130. In the present embodiment, the flash memory 3130 comprises: a first semiconductor chip disposed on a substrate; a first sealing resin sealing the first semiconductor chip; a built-in semiconductor device disposed on the first sealing resin; and a second sealing resin sealing the first sealing resin and the built-in semiconductor device and covering a side surface of the substrate.

In this way, embodiments improve the final yield of semiconductor device manufacturing process. This improvement in yield translate into cost reduction for the manufacturing of various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones.

However, since the access time to the file system 3104 is relatively slow, the media player 3100 can also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power consumption is particularly important when the media player 3100 is a portable media player that is powered by a battery (not shown). The media player 3100 also includes a RAM 3120 and a Read-Only Memory (ROM) 3122. The ROM 3122 can store programs, utilities or processes to be executed in a non-volatile manner. The RAM 3120 provides volatile data storage, such as for the cache 3106. The media player 3100 also includes a user input device 3108 that allows a user of the media player 3100 to interact with the media player 3100. For example, the user input device 3108 can take a variety of forms, such as a button, keypad, dial, etc. Still further, the media player 3100 includes a display 3110 (screen display) that can be controlled by the processor 3102 to display information to the user. A data bus 3124 can facilitate data transfer between at least the file system 3104, the cache 3106, the processor 3102, and the CODEC 3110. The media player 3100 also includes a bus interface 3116 that couples to a data link 3118. The data link 3118 allows the media player 3100 to couple to a host computer.

In one embodiment, the media player 3100 serves to store a plurality of media assets (e.g., songs) in the file system 3104. When a user desires to have the media player play a particular media item, a list of available media assets is displayed on the display 3110. Then, using the user input device 3108, a user can select one of the available media assets. The processor 3102, upon receiving a selection of a particular media item, supplies the media data (e.g., audio file) for the particular media item to a coder/decoder (CODEC) 3110. The CODEC 3110 then produces analog output signals for a speaker 3114. The speaker 3114 can be a speaker internal to the media player 3100 or external to the media player 3100. For example, headphones or earphones that connect to the media player 3100 would be considered an external speaker.

For example, in a particular embodiment, the available media assets are arranged in a hierarchical manner based upon a selected number and type of groupings appropriate to the available media assets. For example, in the case where the media player 3100 is an MP3 type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on.

Figure 16:
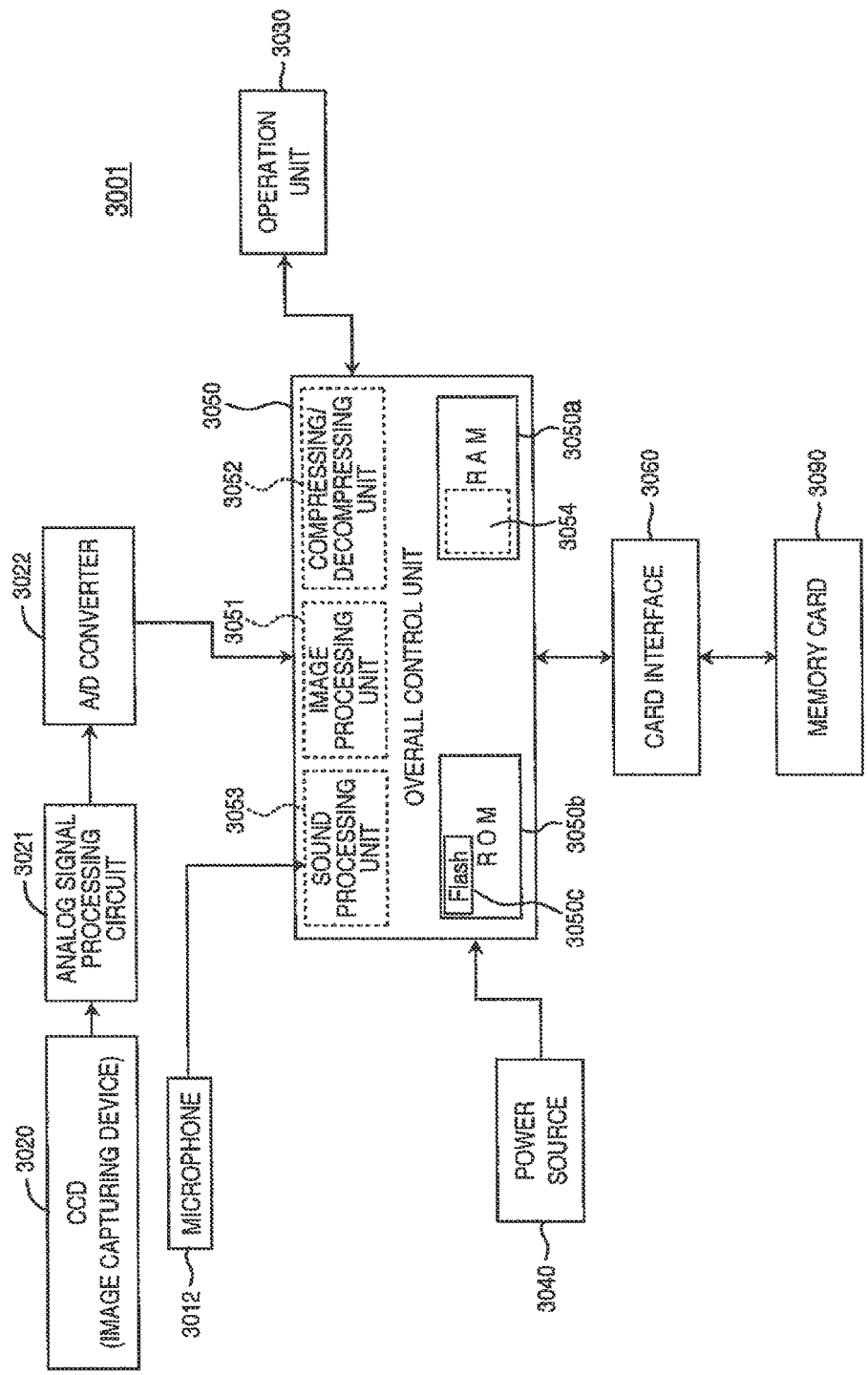
FIG. 16 illustrates an exemplary digital camera, in accordance with an embodiment of the present claimed subject matter.

Referring to FIG. 16, the internal configuration of a digital camera 3001 is described. FIG. 16 is a block diagram showing the internal functions of the digital camera 3001. The CCD (image capturing device) 3020 functions as image capturing means for capturing a subject image and generating an electronic image signal and has, for example, 1600 times 1200 pixels. The CCD 3020 photoelectrically converts a light image of the subject formed by the taking lens into image signals (signal made of a signal sequence of pixel signals received by the pixels) of R (red), G (green) and B (blue) pixel by pixel and outputs the image signal.

The image signal obtained from the CCD 3020 is supplied to an analog signal processing circuit 3021. In the analog signal processing circuit 3021, the image signal (analog signal) is subjected to a predetermined analog signal process. The analog signal processing circuit 3021 has a correlated double sampling circuit (CDS) and an automatic gain control circuit (AGC) and adjusts the level of the image signal by performing a process of reducing noise in the image signal by the correlated double sampling circuit and adjusting the gain by the automatic gain control circuit.

An A/D converter 3022 converts each of pixel signals of the image signal into a digital signal of 12 bits. The digital signal obtained by the conversion is temporarily stored as image data in a buffer memory 3054 in a RAM 3050a. The image data stored in the buffer memory 3054 is subjected to WB (white balance) process, gamma correction process, color correction process and the like by an image processing unit 3051 and, after that, the processed signal is subjected to a compressing process or the like by a compressing/decompressing unit 3052.

A sound signal obtained from the microphone 3012 is inputted to a sound processing unit 3053. The sound signal inputted to the sound processing unit 3053 is converted into a digital signal by an A/D converter (not shown) provided in the sound processing unit 3053 and the digital signal is temporarily stored in the buffer memory 3054.

An operation unit is an operation unit that can include a power source button and a shutter release button and is used when the user performs an operation of changing a setting state of the digital camera 3001 and an image capturing operation.

A power source 3040 is a power supply source of the digital camera 3001. The digital camera 3001 is driven by using a secondary battery such as a lithium ion battery as the power source battery BT.

An overall control unit 3050 is constructed by a microcomputer having therein the RAM 3050a and a ROM 3050b. When the microcomputer executes a predetermined program, the overall control unit 3050 functions as a controller for controlling the above-described components in a centralized manner. The overall control unit 3050 also controls, for example, a live view display process and a process of recording data to a memory card. The RAM 3050a is a semiconductor memory (such as DRAM) which can be accessed at high speed and the ROM 3050b takes the form of, for example, an electrically-rewritable nonvolatile semiconductor memory (such as flash ROM 3050c). A flash memory, in one embodiment, includes: a first semiconductor chip disposed on a substrate; a first sealing resin sealing the first semiconductor chip; a built-in semiconductor device disposed on the first sealing resin; and a second sealing resin sealing the first sealing resin and the built-in semiconductor device and covering a side surface of the substrate.

In this way, embodiments improve the final yield of semiconductor device manufacturing process. This improvement in yield translate into cost reduction for the manufacturing of various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones.

An area as a part of the RAM 3050a functions as a buffer area for temporary storing data. This buffer area is referred to as the buffer memory 3054. The buffer memory 3054 temporarily stores image data and sound data.

The overall control unit 3050 has the image processing unit 3051, compressing/decompressing unit 3052 and sound processing unit 3053. The processing units 3051, 3052 and 3053 are function parts realized when the microcomputer executes a predetermined program.

The image processing unit 3051 is a processing unit for performing various digital imaging processes such as WB process and gamma correcting process. The WB process is a process of shifting the level of each of the color components of R, G and B and adjusting color balance. The gamma correcting process is a process of correcting the tone of pixel data. The compressing/decompressing unit 3052 is a processing unit for performing an image data compressing process and an image data decompressing process. As the compressing method, for example, the JPEG method is employed. The sound processing unit 3053 is a processing unit for performing various digital processes on sound data.

A card interface (I/F) 3060 is an interface for writing/reading image data to/from the memory card 3090 inserted into the insertion port in the side face of the digital camera 1. At the time of reading/writing image data from/to the memory card 3090, the process of compressing or decompressing image data is performed according to, for example, the JPEG method in the compressing/decompressing unit 3052, and image data is transmitted/received between the buffer memory 3054 and the memory card 3090 via the card interface 3060. Also at the time of reading/writing sound data, sound data is transmitted/received between the buffer memory 3054 and the memory card 3090 via the card interface 3060.

Further, by using the card interface 3060, the digital camera 3001 transmits/receives data such as an image and sound and, in addition, can load a program which operates on the digital camera 3001. For example, a control program recorded on the memory card 3090 can be loaded into the RAM 3050a or ROM 3050b of the overall control unit 3050. In such a manner, the control program can be updated.

Also by communication with an external device (such as an external computer) via a USB terminal, various data such as an image and sound and a control program can be transmitted/received. For example, various data, a program, and the like recorded on a recording medium (CD-R/RW or CD-ROM) which is set into a reader (optical drive device or the like) of the external computer can be obtained via the USB terminal.

Finally, various aspects of the present invention are summarized in the following.

According to a first aspect of the present invention, there is provided a semiconductor device including: a first semiconductor chip disposed on a substrate; a first sealing resin sealing the first semiconductor chip; a built-in semiconductor device disposed on the first sealing resin; and a second sealing resin sealing the first sealing resin and the built-in semiconductor device and covering a side surface of the substrate.

The above-described semiconductor device further includes a bump provided on an opposite surface of the substrate to a surface on which the first semiconductor chip is disposed. In the above-described semiconductor device, the semiconductor chip may electrically be connected to the substrate by a wire.

In the above-described semiconductor device, the built-in semiconductor device may include a second semiconductor chip. In the above-described semiconductor device, the built-in semiconductor device may have a third sealing resin sealing the second semiconductor chip. According to an aspect of the present invention, it is possible to further reduce the height of the semiconductor device, and further downsize the semiconductor device.

The above-described semiconductor device further includes a third semiconductor chip disposed on the built-in semiconductor device. The second sealing resin sealing the first sealing resin, the built-in semiconductor device and the third semiconductor chip, and covering a side surface of the substrate. According to an aspect of the present invention, three semiconductor chips can be stacked with ease, thereby further downsizing the semiconductor device.

According to a second aspect of the present invention, there is provided a method of fabricating semiconductor device including: disposing first semiconductor chips on a substrate; sealing the first semiconductor chips by first sealing resins; cutting the substrate between the first sealing resins to form divided substrates; disposing divided substrates on a dummy sheet; forming a second sealing resin sealing built-in semiconductor devices disposed on the first sealing resins, and covering dummy sheet between the first sealing resins; and cutting the second sealing resin between the first sealing resins.

In the above-described method, cutting the second sealing resin may include cutting the second sealing resin as the second sealing resin remaining on a side surface of the substrate. According to an aspect of the present invention, it is possible to prevent the second sealing resin from peeling off between the substrate and the second sealing resin, due to the mechanical stress, temperature change, and moisture change.

The above-described method may further include forming bumps on an opposite surface of the substrate to a surface on which the first semiconductor chips are disposed.

In the above-described method, disposing the divided substrates on the dummy sheet may include disposing the divided substrates so that the bumps are embedded in the dummy sheet. According to an aspect of the present invention, in the fabrication process of the semiconductor device, it is possible to improve the heat transmission between the dummy sheet and the substrate, thereby providing a fabrication process of a high-quality semiconductor device.

In the above-described method, the dummy sheet may have openings in regions in which the divided substrates are disposed. According to an aspect of the present invention, in the fabrication process of the semiconductor device, it is possible to improve the heat transmission between the dummy sheet and the substrate, thereby providing a fabrication process of a high-quality semiconductor device. In the above-described method, the dummy sheet may have depressions in regions in which the divided substrates are disposed. According to an aspect of the present invention, it is possible to prevent the misalignment of the substrate on the dummy sheet. It is therefore possible to provide a fabrication process of a high-quality semiconductor device.

The above-described method may further include electrically testing the first semiconductor chips on the divided substrates before disposing the divided substrates on the dummy sheet. According to an aspect of the present invention, by electrically testing the first semiconductor chip disposed on the substrate that has been cut, the subsequent fabrication processes are not performed on an electrically defective first semiconductor chip with the first semiconductor chip mounted. This can suppress the fabrication costs.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A non-volatile memory comprising:
a first semiconductor chip disposed on a first surface of a first substrate, wherein the first substrate comprises a second surface opposing the first surface;
a first resin sealing the first semiconductor chip;
a built-in semiconductor device comprising:
a second substrate;
a second semiconductor chip disposed on the second substrate; and
a second resin sealing the second semiconductor chip, the second resin of the built-in semiconductor device disposed on the first resin; and
a third resin sealing the first resin and the built-in semiconductor device and covering a side surface of the first substrate and not extending beyond the second surface of the first substrate.

2. The non-volatile memory of claim 1, wherein the non-volatile memory comprises flash memory.

3. The non-volatile memory of claim 2, wherein the flash memory is NAND flash memory.

4. The non-volatile memory of claim 2, wherein the flash memory is NOR flash memory.

5. The non-volatile memory of claim 1, further comprising an adhesive disposed between the first resin and the built-in semiconductor device.

6. The non-volatile memory of claim 1, wherein the built-in semiconductor device further comprises an adhesive disposed between the second substrate and the second semiconductor chip.

7. The non-volatile memory of claim 1, wherein:
the first substrate comprises a first pad electrode disposed on the first surface of the first substrate,
the second substrate comprises a second pad electrode disposed on a first surface of the second substrate,
the second substrate comprises a third pad electrode disposed on a second surface of the second surface,
the first and second pad electrodes are electrically connected together via a wire, and
the third pad electrode is electrically connected to the second semiconductor chip via another wire.

8. A mobile device comprising:
a flash memory device, the flash memory device comprising:
a substrate comprising a first surface and a second surface opposing the first surface;
a first semiconductor chip disposed on the first surface;
a first resin sealing the first semiconductor chip;
an adhesive disposed on the first resin;
a built-in semiconductor chip disposed on the adhesive; and
a second resin sealing the first resin, the adhesive, the built-in semiconductor chip, and covering a side surface of the first substrate and not extending beyond the second surface of the first substrate.

9. The mobile device of claim 8, wherein the built-in semiconductor chip comprises a third resin.

10. The mobile device of claim 8, wherein the built-in semiconductor chip comprises:
a second substrate;
a second semiconductor chip mounted to the second substrate; and
a third resin sealing the second semiconductor chip, wherein the third resin is disposed on the adhesive.

* * * * *